(12) United States Patent
Steiner et al.

(10) Patent No.: US 7,533,791 B2
(45) Date of Patent: May 19, 2009

(54) ARRANGEMENT FOR WELDING WORKPIECES BY MEANS OF AN ULTRASONIC DEVICE

(75) Inventors: Ernst Steiner, Heuchelheim (DE); Horst Dieterle, Niederweimar (DE); Dieter Stroh, Wettenberg (DE); Heiko Stroh, Wettenberg (DE); Peter Wagner, Wettenberg (DE)

(73) Assignee: Schunk Ultraschalltechnik GmbH, Wettenberg (DE)

( * ) Notice: Subject to any disclaimer, the term of this patent is extended or adjusted under 35 U.S.C. 154(b) by 141 days.

(21) Appl. No.: 11/628,554

(22) PCT Filed: Jul. 7, 2005

(86) PCT No.: PCT/EP2005/007346

§ 371 (c)(1),
(2), (4) Date: Jan. 18, 2007

(87) PCT Pub. No.: WO2006/005509

PCT Pub. Date: Jan. 19, 2006

(65) Prior Publication Data

US 2007/0257088 A1 Nov. 8, 2007

(30) Foreign Application Priority Data

Jul. 9, 2004 (DE) .................. 10 2004 033 575

(51) Int. Cl.
*B23K 1/06* (2006.01)
*B23K 37/00* (2006.01)
*B29C 65/08* (2006.01)

(52) U.S. Cl. ................ 228/1.1; 228/4.5; 156/580.1

(58) Field of Classification Search ... 228/110.1–111.5, 228/1.1, 4.5, 904, 180.5; 156/64, 73.1–73.4, 156/358, 580.1
See application file for complete search history.

(56) References Cited

U.S. PATENT DOCUMENTS

| | | | | |
|---|---|---|---|---|
| 4,155,499 A | * | 5/1979 | Denslow ................... 228/111 |
| 4,596,352 A | * | 6/1986 | Knapp ...................... 228/1.1 |
| 4,730,764 A | * | 3/1988 | Hawkins et al. ........... 228/1.1 |
| 4,782,990 A | | 11/1988 | Patrikios et al. |
| 4,817,814 A | * | 4/1989 | Coto et al. ............... 228/110.1 |
| 4,842,671 A | * | 6/1989 | Nuss ........................ 156/433 |
| 4,867,370 A | * | 9/1989 | Welter et al. ............. 228/110.1 |
| 4,869,419 A | * | 9/1989 | Nuss ...................... 228/110.1 |

(Continued)

FOREIGN PATENT DOCUMENTS

DE            3529943 A1 *  2/1987

(Continued)

*Primary Examiner*—Jessica L Ward
*Assistant Examiner*—Carlos Gamino
(74) *Attorney, Agent, or Firm*—Dennison, Schultz & MacDonald

(57) ABSTRACT

An arrangement for the welding of cables by means of an ultrasonic welding device with a compression chamber for housing the cables defined by at least sections of a sonotrode transmitting ultrasonic vibrations, a counter electrode and lateral defining elements. In order to guarantee a desired layout for the cables, the components are installed in an insertion space, before closing the compression chamber, the width of which is less than that of the open compression chamber.

27 Claims, 10 Drawing Sheets

U.S. PATENT DOCUMENTS

Figure 1:
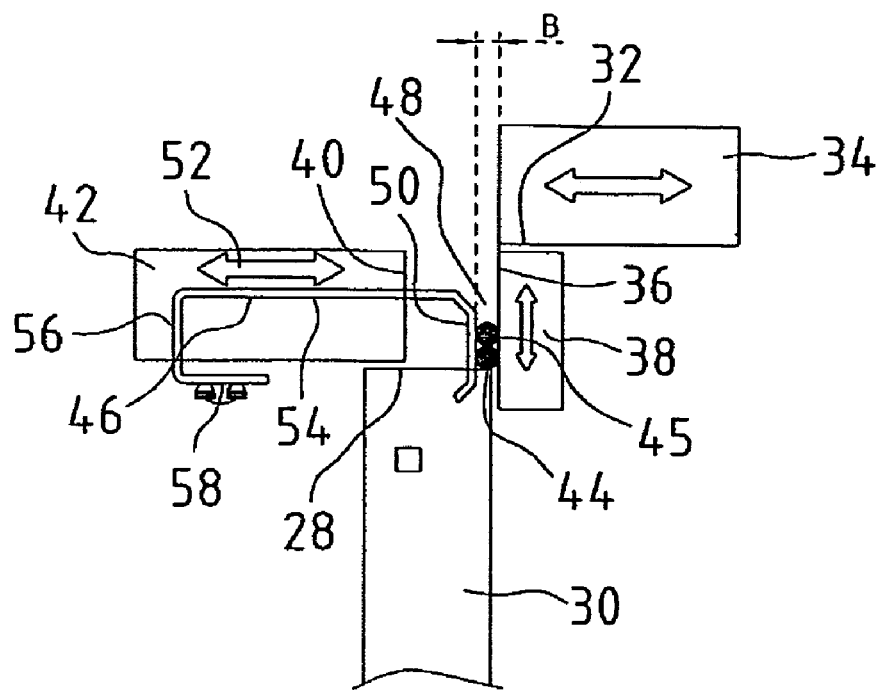

| | | | |
|---|---|---|---|
| 5,137,200 A * | 8/1992 | Edwards et al. | 228/1.1 |
| 5,509,994 A * | 4/1996 | Recchia et al. | 156/468 |
| 5,772,100 A * | 6/1998 | Patrikios | 228/1.1 |
| 5,857,259 A * | 1/1999 | Johnston | 29/858 |
| 6,070,777 A * | 6/2000 | Patrikios et al. | 228/1.1 |
| 6,079,608 A * | 6/2000 | Steiner et al. | 228/110.1 |
| 6,299,052 B1 | 10/2001 | Wnek et al. | |
| 6,302,981 B1 * | 10/2001 | Sakaguchi et al. | 156/73.1 |
| 6,588,646 B2 * | 7/2003 | Loprire | 228/110.1 |
| 6,863,205 B2 * | 3/2005 | Wnek et al. | 228/1.1 |
| 7,090,111 B2 * | 8/2006 | Egan et al. | 228/1.1 |
| 7,217,332 B2 * | 5/2007 | Brown et al. | 156/73.2 |
| 7,459,653 B2 * | 12/2008 | Steiner et al. | 219/56 |
| 2004/0178249 A1 * | 9/2004 | Gordon, Jr. | 228/110.1 |
| 2006/0169742 A1 * | 8/2006 | Fujimoto et al. | 228/4.5 |

FOREIGN PATENT DOCUMENTS

| | | |
|---|---|---|
| DE | 3719083 | 9/1988 |
| DE | 9001070 | 7/1991 |
| DE | 4129633 A1 * | 5/1992 |
| DE | 4406337 | 8/1995 |
| DE | 19540860 | 5/1997 |
| EP | 154709 A1 * | 9/1985 |
| WO | 0243915 | 6/2002 |

* cited by examiner

ARRANGEMENT FOR WELDING WORKPIECES BY MEANS OF AN ULTRASONIC DEVICE

This application is a filing under 35 USC 371 of PCT/EP2005/007346, filed Jul. 7, 2005.

The invention relates to an arrangement for welding workpieces, such as electric conductors, particularly cables, using an ultrasound welding device comprised of a compression chamber for housing the workpieces that is defined by sections of a sonotrode that transmits ultrasonic vibrations and a counter electrode, and a defining element that extends vertically from the sections of the sonotrode and the counter electrode and has a first defining surface, and by a sliding element that is adjustable in relation to the first defining surface and has a second defining surface. With the compression space open, the workpieces can be introduced into an insertion space, which is limited by at least the sections of the sonotrode and the first defining surface of the defining element.

A corresponding arrangement is seen in U.S. Pat. No. 6,299,052. There, the insertion space is defined by the sonotrode, the defining element, and the sliding element. The sliding element is adjusted in relation to the defining element when inserting the conductors, so that the latter are essentially aligned parallel to each other and in vertical rows. This results in considerable disadvantages, especially when few conductors are to be welded, as in that case the distance between the sliding element and the first defining surface of the defining element is very small, so that inserting the conductors can lead to problems.

The known device for welding the conductors corresponds to that in DE-C-37 19 083. There, the counter electrode, termed a crosshead, functions as one section of a multipart anvil, where the crosshead is a displaceable extension of the defining element having the first defining surface, the defining element being vertically displaceable in relation to the section, or as the case my be, the surface of the sonotrode, on which the conductors to be welded rest.

To enable adjustment to conductors of different width, DE-C-44 06 337, DE-A-195 40 860 and U.S. Pat. No. 4,782,990 provide for compression chambers of adjustable height and width for the ultrasonic welding of cables. According to the last named document, the device is configured as a hand-held welding device.

An ultrasound welding device according to DE-U-90 01 070 provides for a compression chamber that has two lateral slides, ramp-shaped on the outside, between which a movable work surface of a sonotrode is arranged.

The present invention is based on the task of further developing an arrangement of the type described at the beginning in order to enable the well-directed insertion or arrangement of the conductors to be welded in the compression chamber, it being possible to open the compression chamber to an extent that does not obstruct insertion.

In the case of this invention, this task is essentially resolved by having the insertion space also limited by a guide element that has a guide section running along the first defining surface of the defining element, where the distance between the guide section of the guide element and the first defining surface is smaller than the distance between the first defining surface and the second defining surface of the sliding element when the compression chamber is open. In an alternative solution, the insertion space is defined by two blades of a guide element or sections thereof, which extend, at least in some sections, along both the first defining surface and the second defining surface, where the effective distance between the blades or, as the case may be, their sections, is smaller than the distance between the first and second defining surfaces with the compression chamber open. The guide element can be configured such that a diagonal blade connecting the blades runs above the section of the sonotrode that defines the compression chamber, thus forming the floor of the insertion space. Alternatively, the diagonal blade can run below the section of the sonotrode, so that it defines the floor of the insertion space.

Regardless of the configuration of the guide element, the invention provides the possibility, through simple measures applying to construction, independently of the width, or as the case may be, breadth of the compression chamber, of aligning electric conductors, and in particular cables, which are to be welded, in relation to each other, so that compacting and welding are assured to the required extent. The general teaching of the invention is therefore expressed in an arrangement for the welding of workpieces, such as electrical conductors, in particular cables, using an ultrasound welding device, comprising a compression chamber housing the workpieces, where the workpieces, with the compression chamber open, can be inserted into an insertion space, whose effective width is smaller than the corresponding width of the open compression chamber.

In other words, an ultrasound welding device is equipped with an auxiliary element which, when inserting the workpieces to be welded, especially electric conductors such as cables, can be aligned with the sonotrode and the defining element, or as the case may be, the sliding element, with the compression chamber open, in such a way that the conductors can be aligned with each other to the desired degree, so that in the subsequent welding process, correct and reproducible welding is assured.

Unlike the known solution, the insertion space is not or is not exclusively defined by the elements that surround the compression chamber. What is more, with the sliding element withdrawn, the remaining space is limited by the guide element, without the insertion of the conductors being obstructed by the sliding element and the defining element, which maintain a sufficient distance from each other. At the same time, however, the conductors to be welded are aligned with each other to the required extent, being positioned in rows that are perpendicular or approximately perpendicular to the welding surface formed by the sonotrode and therefore not crossing each other, which would impair the welding result.

The guide element itself is configured as an element that can be bent outward or adjusted when the compression chamber is closed, so that the actual welding process or, as the case may be, the prior compression process, is not obstructed.

The guide element is preferably configured as a lamellar spring plate, so that sufficient flexibility is assured when inserting the conductors.

The guide element can therefore be an arched spring plate with at least two blades, where one of the blades in particular can run along the adjustable path of the defining element, and the other blade along the guide section that extends along the first defining surface.

In order to correctly fix the spring plate in place and avoid detracting from the flexibility of the guide element, a further development of the invention sees the spring plate as comprised of a holding blade and first inner blade that runs vertical to the holding blade, the inner blade merging with the blade running along the adjustable path of the sliding element as a second inner blade, and merging with the blade that runs vertical to it, at least in sections, and along the first limiting surface, as the guide section.

The holding blade and the first and second inner blades preferably display the geometry of a "U" with arms of different length, which, when including the guide section, forms an open quadrangle.

The spring plate in particular should comprise at least three blades, one of which is configured as the guide section, an abutting blade that runs parallel to the defining surface formed by the sonotrode, and a third blade that is configured as a holding blade, or which merges into such a holding blade at an angle to the third blade. If the spring plate consists of three blades, they should, when not under pressure, display the geometry of a "U" with arms of different lengths, in which the third blade, which runs parallel to the guide section, serves to fix the spring plate in place.

The holding element itself proceeds from the ultrasound welding device and should extend along an outer surface of the sliding element, which runs perpendicular to both the section of the sonotrode and the first defining surface. In order to ensure secure guiding of the conductors to be inserted, a corresponding guide element can be provided along each corresponding outer surface of the side of the siding element.

In addition, with the compression chamber open, the guide section of the guide element should extend for a distance along the first defining surface that is greater than the effective length of the first defining surface with the compression chamber closed.

In order to additionally facilitate the insertion of the workpieces, such as cables, which are to be aligned with each other, a further development of the invention provides for the guide section that is also designated as the guide blade to run, at least in sections, at an angle α to the first defining surface, at least in the area that merges with the second inner blade. The angle α could preferably range between 15° and 60°, to name two numerical values as examples.

If the guide element, as is preferable, is fixed in place, and is bent out of the way during welding of the workpieces, a further development of the invention provides for the guide element to be both displaceable and pivotable. For this purpose, the guide plate, for example, or as the case may be, the holding blade, can originate from a piston of a jack cylinder, in order to pull the guide element away when the compression chamber is closed.

From the state of the art, it is known that the sliding element is limited by a catch in its direction of movement in the direction of the first defining surface, in order to limit the width of the compression chamber. According to the invention, the drive used to set the catch can be used in such a way that the guide element is connectable with the actuator, so that in consequence, an adjustment of the guide section or, as the case may be, the guide blade on the first defining surface can be made depending on the number of workpieces to be welded, which, in turn, can determine the width of the compression chamber, and thus the position of the catch for the sliding element. The drive for the catch, and thus the guide element, is particularly a spindle drive.

If the guide element is preferably an arched spring plate, one alternative provides for the guide element to be a laminar plate element that extends along at least one outer surface of the sliding element that extends along the adjustable path of the sliding element, which stretches open a level that runs parallel or approximately parallel to the outer surface, and is perpendicular or approximately perpendicular to the section of the sonotrode, the plate element being connected to the sliding element and adjustable in relation to it. The plate element can have a mechanical link to a spring element, by means of which the plate element is adjustable relative to the sliding element in the direction of the first defining surface.

In order to adjust the distance between the spring plate and the first defining surface, and thus the width of the insertion space, a further development of the invention provides for the spring plate that is under pressure in the direction of the first defining surface to be movable in the direction of an adjustable catch, whose position is adjusted to the width of the insertion space. Alternatively, there is the possibility of connecting the spring plate to a drive, so that the spring plate can be adjusted to the first defining surface to the desired degree thereby allowing the width of the insertion space to be determined.

In particular, it is proposed that the plate element have at least one slot that runs parallel to the adjustable path, the slot being engaged by a protrusion of the sliding element, such as a pin. In order to ensure secure operation, two slots in particular are foreseen, each of which is engaged by a protrusion of the sliding element. These measures ensure that when the compression chamber is open, the plate element with its guide section is displaced to the desired extent in the direction of the first defining surface of the sliding element, without the insertion of workpieces through the sliding element being obstructed. If the sliding element is then moved in the direction of the first defining surface when closing the compression chamber, the guide element can be moved relative to it, so that no obstruction is created.

The guide plate itself is preferably rectangular in shape with the first and second longitudinal blades, which run along the adjustable path, and the diagonal blades that connect them and run along the first defining surface, making up the guide section. In order to facilitate insertion, the transitional area between the longitudinal blade on the side of the insertion-space opening, and the diagonal blade is slanted.

In order to enlarge the insertion space when reversing the sliding element, a further development provides for an engaging piece which proceeds from the sliding element, and which engages the plate element or an element proceeding from it like a latch, the engaging piece and the element meshing when the sliding element is moved away from the first defining surface.

Even though it would, in principle, be sufficient to have a corresponding plate element, which is adjustable in relation to the sliding element, along only one of the external surfaces of the sliding element, it is considered preferable to arrange a guide element along each external surface of the sliding element that runs perpendicular or approximately perpendicular to the sonotrode section.

Other details, advantages, and characteristics of the invention are disclosed not only in the claims, the features they describe—individually and/or in combination—but also in the following description of examples of preferred embodiments depicted in the set of drawings.

Figure 2:
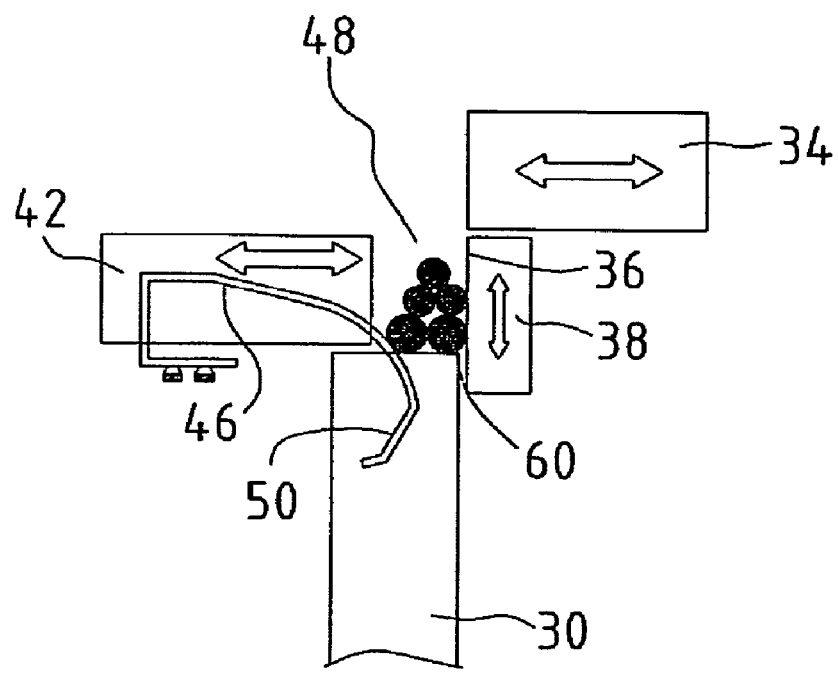
Figure 3:
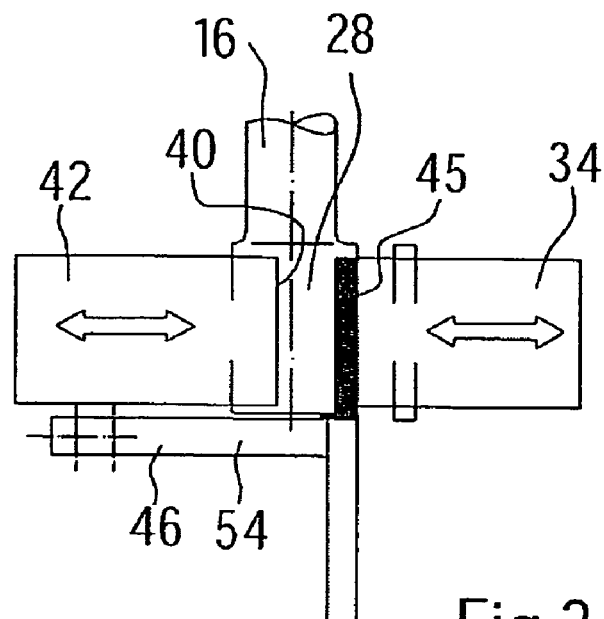
Figure 4:
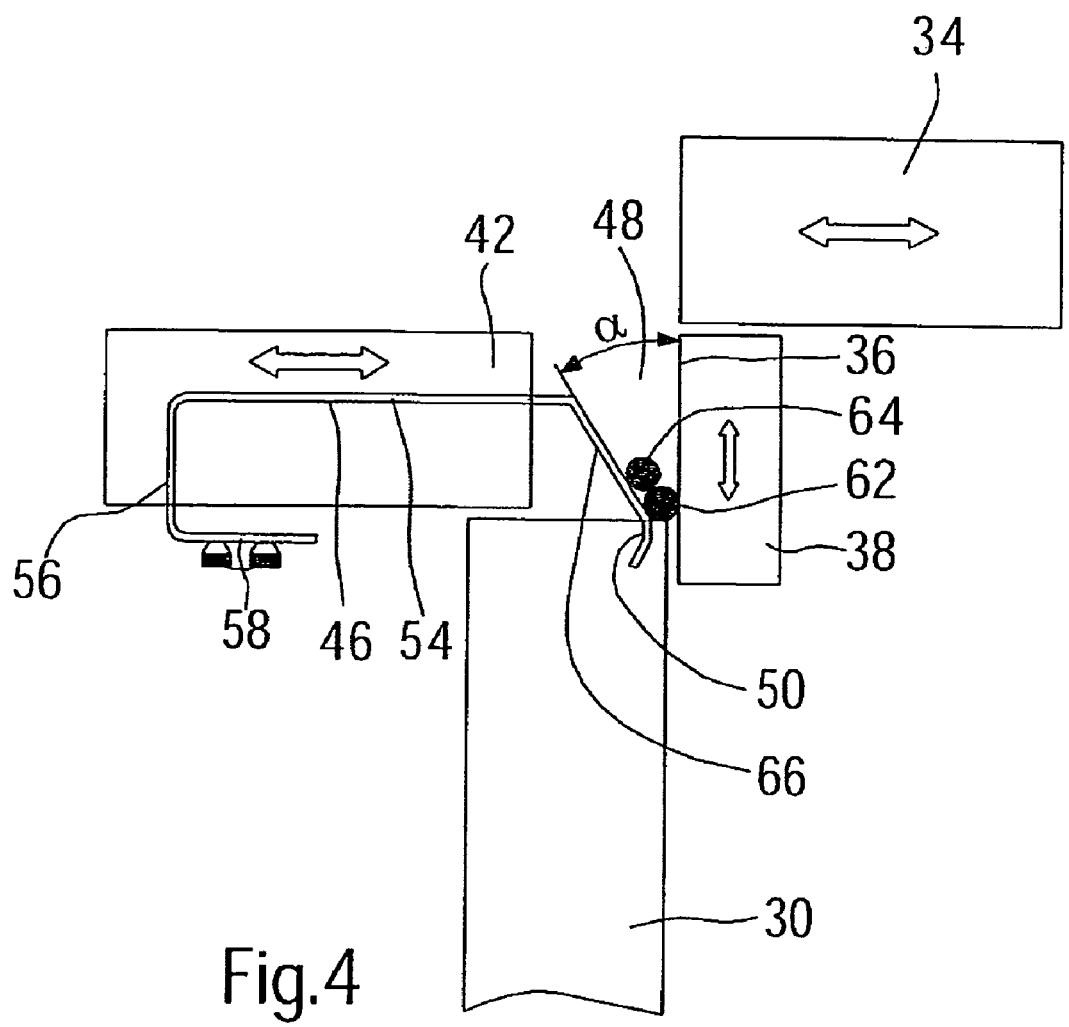

Shown in:

FIG. 1 a front view of a compression chamber of an ultrasound welding device, FIG. 2 the compression chamber according to FIG. 1, with a varying number of conductors to be welded, FIG. 3 the compression chamber according to FIG. 1, top view, FIG. 4 an alternative embodiment of a guide plate for a compression chamber corresponding to FIG. 1-3, FIG. 5 a configuration of a guide element that can be adjusted to a compression chamber according to FIG. 1-4

Figure 5:
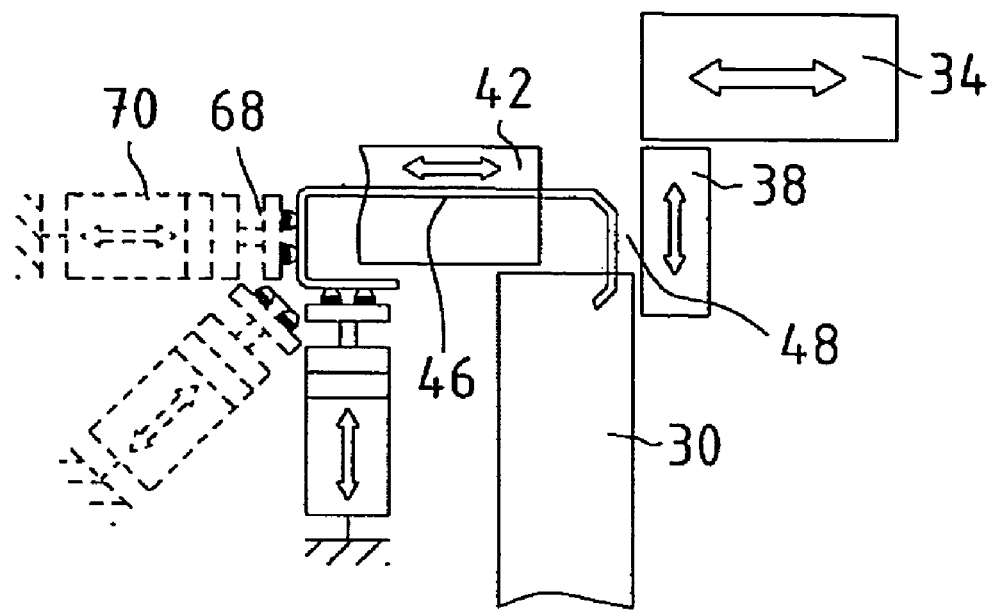
Figure 6:
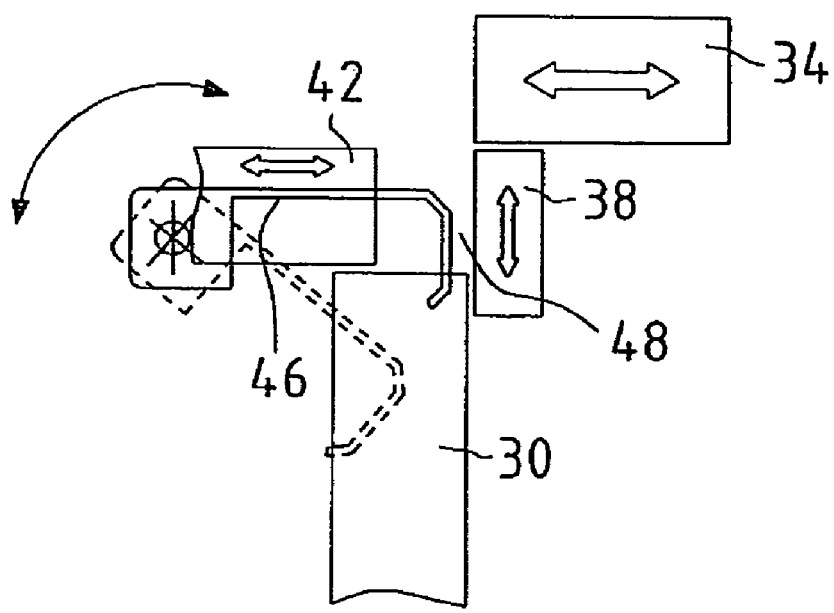

FIG. 6 an alternative version of the one seen in FIG. 5

Figure 7:
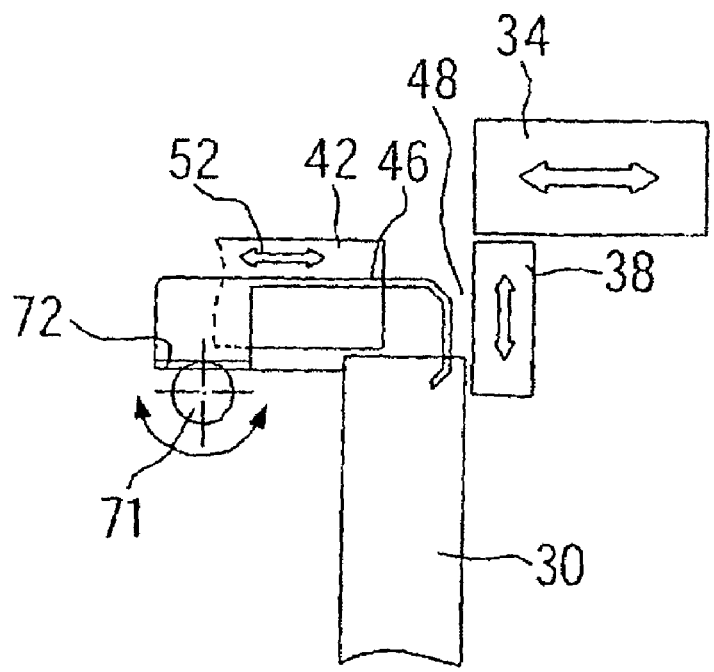

FIG. 7 an additional version of a guide element that can be adjusted to a compression chamber according to FIG. 1-5

Figure 8:
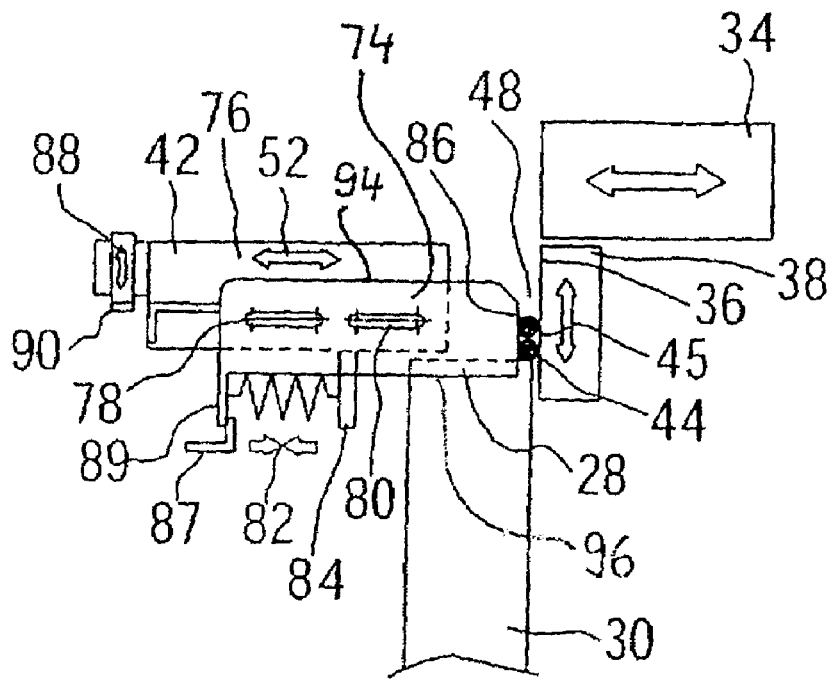
Figure 9:
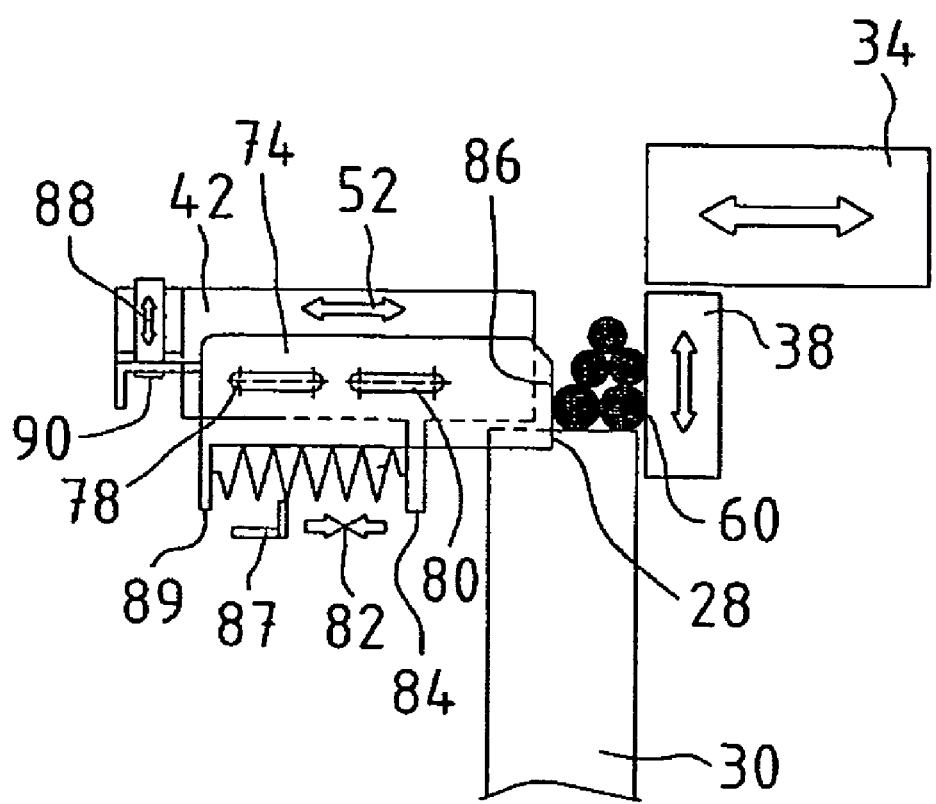
Figure 10:
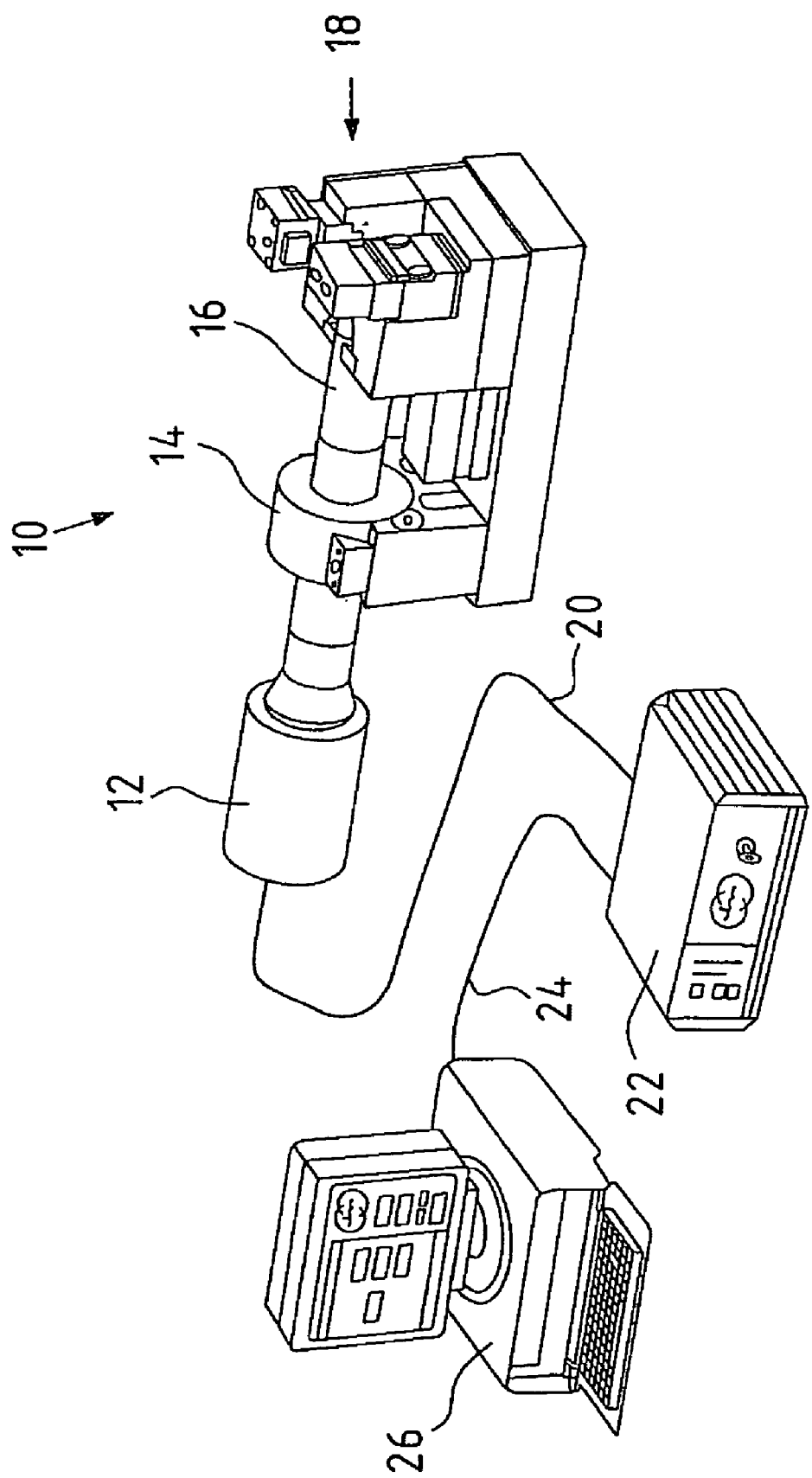
Figure 11:
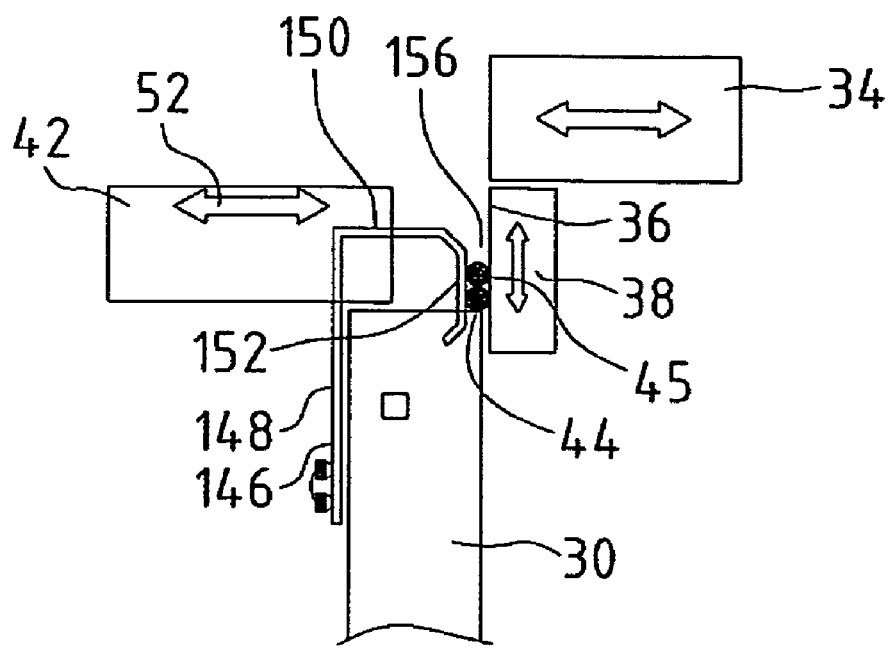
Figure 12:
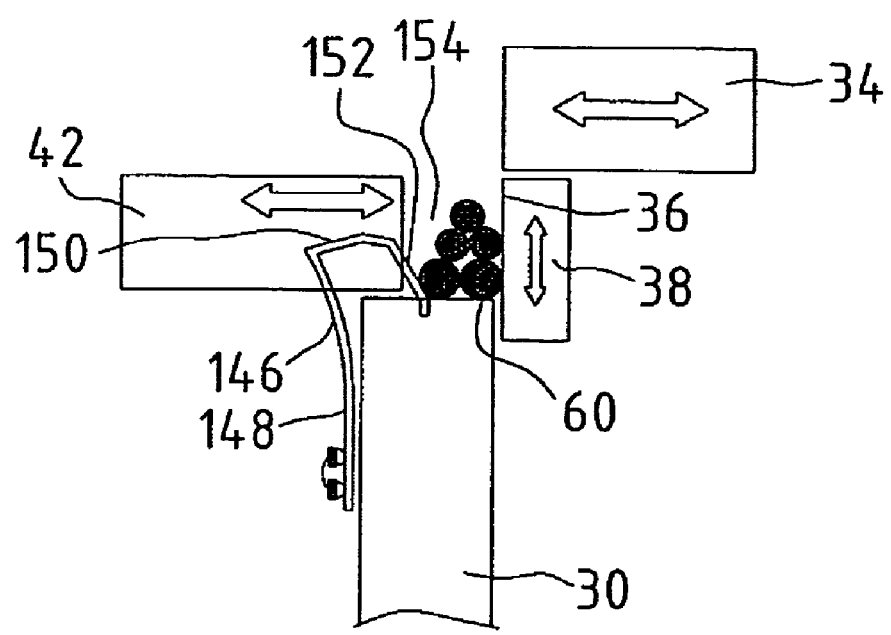
Figure 13:
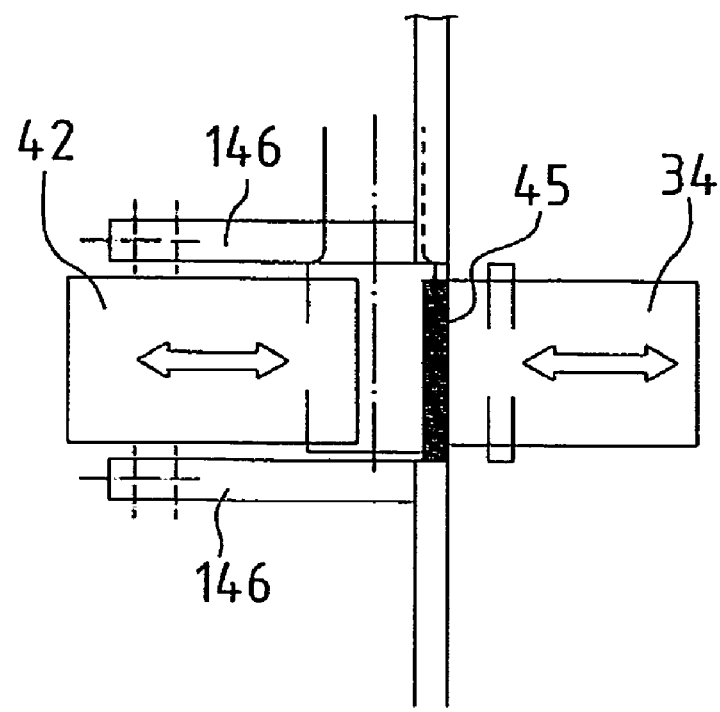
Figure 14:
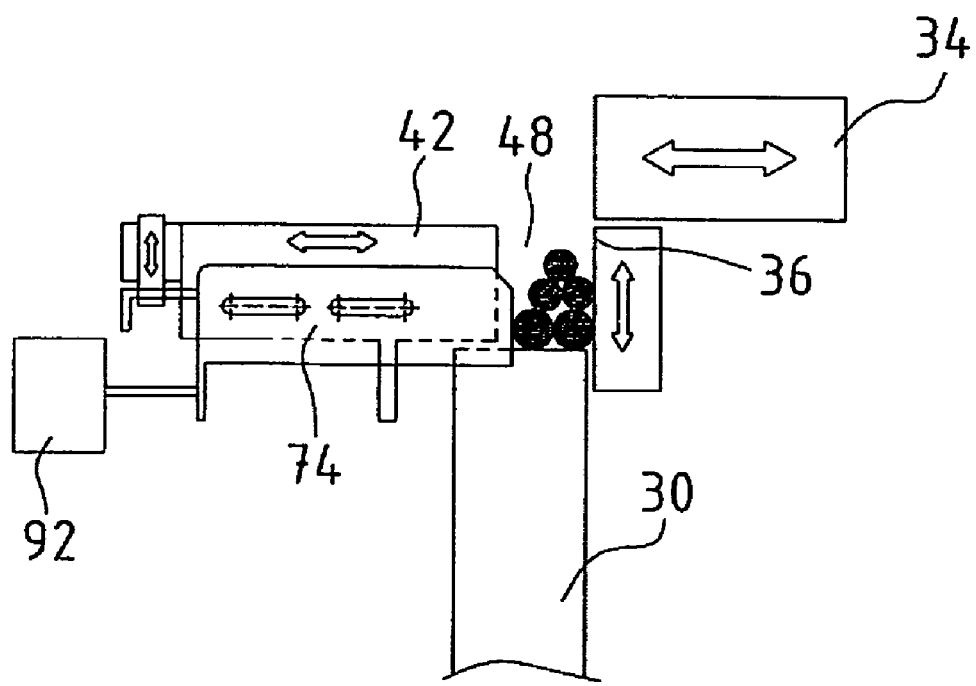
Figure 15:
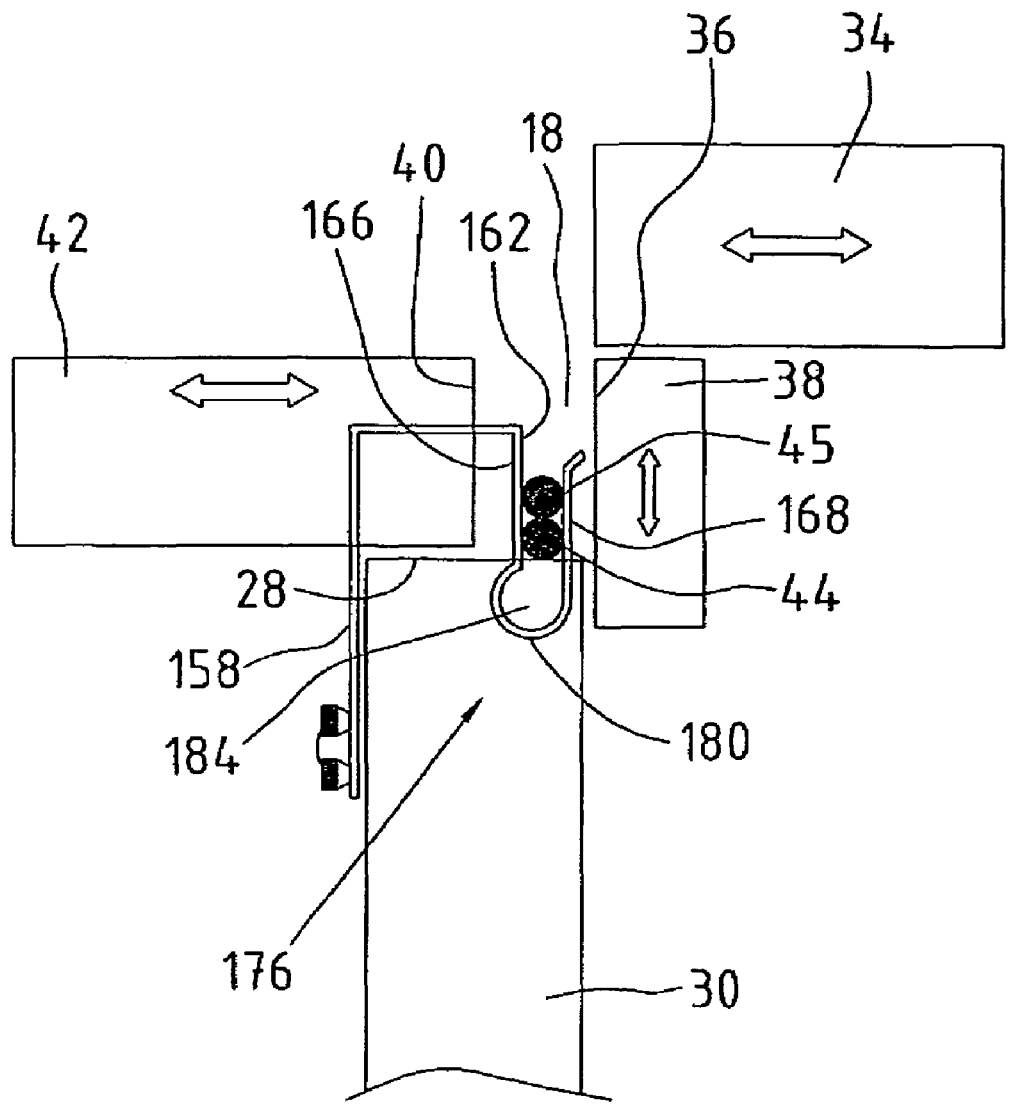
Figure 16:
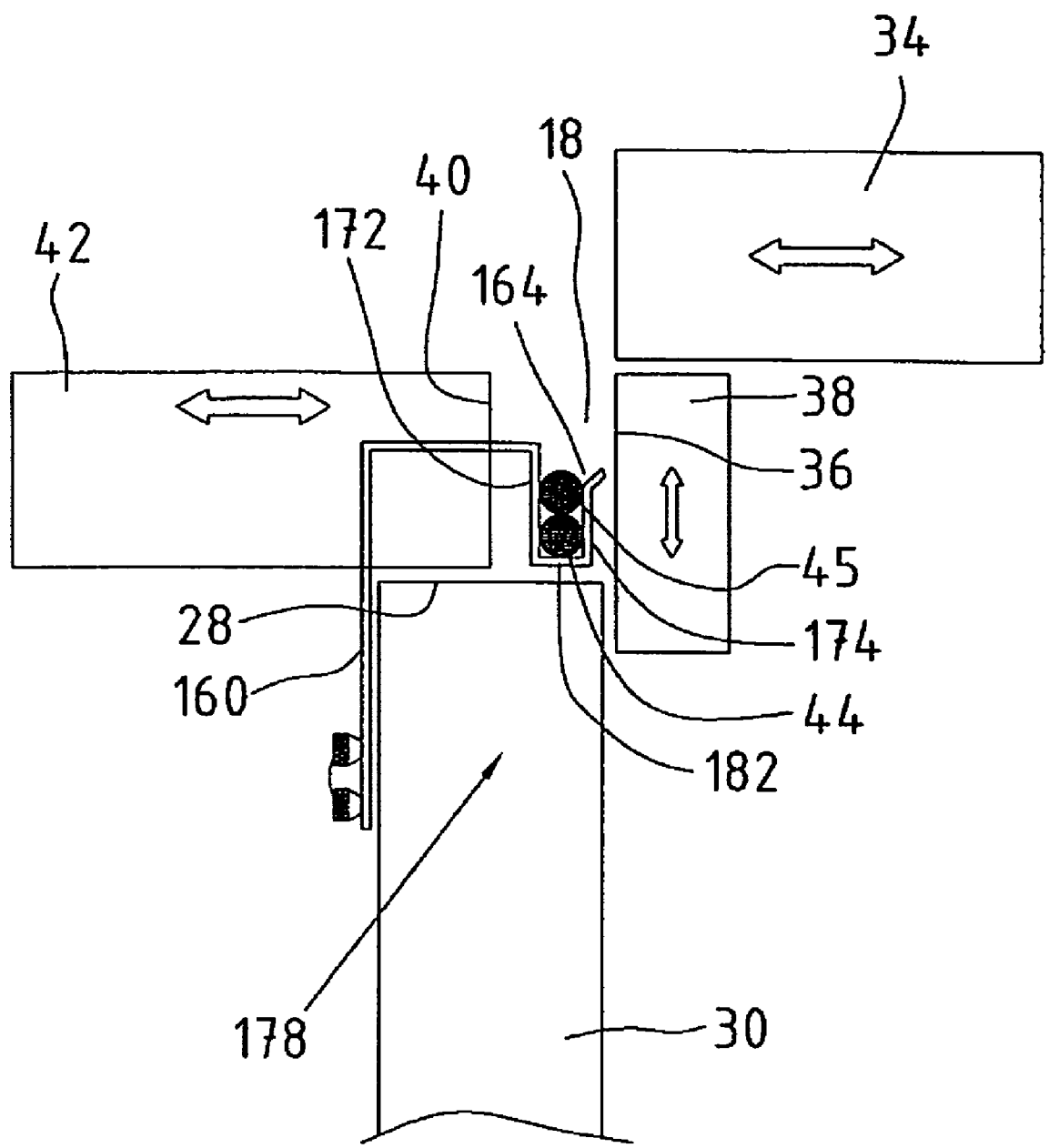

FIG. 8 an additional version of a guide element adapted to a compression chamber FIG. 9 a diagram corresponding to FIG. 8, however with a larger number of conductors, FIG. 10 a schematic diagram of an ultrasound welding device with peripheral devices, FIG. 11-13 a compression chamber corresponding to the diagrams in FIG. 1-3 with an alternative version of a guide element, FIG. 14 an alternative version of the arrangement according to FIGS. 8 and 9, FIG. 15 an additional version of a guide element for a compression chamber and FIG. 16 an alternative form of the guide element according to FIG. 15.

FIG. 10 shows in purely schematic terms an arrangement for welding workpieces such as electrical conductors or cables into nodes. For this purpose, there is an ultrasound welding device or machine 10, which, in the conventional manner, comprises a converter 12, possibly a booster 14, and a sonotrode 16. The sonotrode 16 or, as the case may be, a counter electrode that is assigned to it, and which will be described in detail below, define a compression chamber 18, as described, for example, in U.S. Pat. No. 4,596,352, U.S. Pat. No. 4,869,419 or DE-C-37 19 083. The height and length of the compression chamber 18 can be adjusted, in order to adjust its cross-sectional area to the number or cross-sectional area of the conductors that are to be welded. The converter 12 is connected by a wire 20 with a generator 22, which is in turn connected via a wire 24 to a computer 26, where welding parameters, such as the cross-sectional area of the conductors to be welded are entered. The power output of the generator 22 can then be specified, in order to retrieve the required welding parameters by means of a program stored in the computer 26 and correspondingly, using the converter 12, produce the ultrasound vibrations, which are transmitted, magnified, via the booster 14 to the sonotrode 16 or, as the case may be, to its welding surface.

FIGS. 1-9 show the essential elements of the compression chamber 18, whose cross-sectional area can be adjusted, that is, whose height and width can be adjusted in these versions. The compression chamber 18 is defined by a section 28 of the sonotrode 16 or, as the case may be, the head thereof 30, that forms the welding surface; by a section 32 of a counter electrode 34, which faces the section 28 of the sonotrode head 30; by a defining element 38, which provides a first defining surface 36, and which is vertically adjustable in relation to the section 28 of the sonotrode 30; and by a sliding element, which has a second defining surface 40 and is called a lateral slider 42. During welding, the compression chamber 18 is closed, so that the sonotrode head 30, the counter electrode 34, the defining element 30 and the lateral slider 42, with their sections or surfaces 28, 32, 36, 40, make contact with the workpieces to be welded, such as conductors 44, 45, so that these can be compressed and welded.

In order to achieve proper welding, especially welding into a node, it has been shown that the conductors to be welded 44, 45 should be arranged parallel to one another and one above the other in the compression chamber 18. This is seen in principle in FIG. 1, where the two conductors that are to be welded together 44, 45 are arranged one above the other and parallel to each other.

Regardless of that consideration, in order to open the compression chamber 18 wide enough, i.e. in order to achieve a sufficiently large gap between the defining element 38 and the lateral slider 42, that is, in order to adjust their defining surfaces 36, 40, so that insertion of the conductors 44, 45 is not obstructed or hampered, the invention, as illustrated in the versions 1-7, provides for an insertion space 48 above a guide element configured as an arched spring plate 46, the width B of the insertion space being determined by the cross-sectional area of the conductors 44, 45 that are to be welded, and which are placed one over the other. The spring plate 46 can proceed from a section of the housing of the ultrasound device.

In this version, the spring plate 46 displays the geometry of an open quadrangle, in which the non-attached outer blade 50 runs along the first defining surface 36 provided by the defining element 38. The outer blade 50, which can also be termed a guide or lead blade or section, merges with an inner blade 54, which runs along the adjustable path, symbolized by a double arrow 52, of the lateral slider 42, the inner blade in turn merging with another inner blade 56, preferably curved at a 90° angle, which leads to a holding blade 58 running perpendicular to it, onto which the spring plate 46 is fixed. In this way, the holding blade 58 and the inner blades 54, 56 form a "U" with lateral arms of different lengths. By means of this geometry, the spring plate 46 has sufficient flexibility in the area of the outer blade 50, which is perpendicular to the holding blade 58, at the same time as there is stability in the direction of the inner blade 54, which runs along the adjustable path 52, all of which guarantees the desired well-aimed insertion of the conductors 44, 45 into the insertion space 48, which is laterally defined by the outer blade 50 and the first defining surface 36.

With the geometry of an open rectangle, the spring element 46 displays a flexibility of the type described above, which makes it possible to push the spring element 46 aside, when the width of the insertion space 48 has been set, and more conductors 60 are to be inserted than the gap between the guide or lead blade 50 and the first defining surface 36 of the defining element 38 would allow, as is illustrated by FIG. 2. Notwithstanding, the conductors that were introduced first are arranged one above the other, that is in rows, as can be seen in FIG. 1, which, after pushing away the spring plate 46, then allows a further desired alignment of the conductors 60, which will ensure proper welding to a node.

An arrangement corresponding to that seen in FIGS. 1-3 can be seen in FIGS. 11-13, so that the same reference signs can be used for the same elements. However, the guide element, also in the form of an arched spring plate, does not display the geometry of an open rectangle, but rather that of a "U" with arms of different lengths. Here the spring plate 146 is comprised of a laterally extended holding blade 148, an inner blade 150 that runs perpendicular to it when there is no pressure on it, and a lead or guide blade 152 at a 90° angle to it that runs along the first defining surface 36, the gap between this guide blade and the first defining surface 36 being the width of the insertion space 156, in order to bring the conductors 44, 45 into the desired alignment with each other. If the number of conductors that are supposed to be introduced into the insertion space 156 or, as the case may be, their cross-sectional area is greater than the cross section determined by the gap between the guide blade 152 and the first defining surface 36, the guide blade 152 is bent away from the sonotrode head 30 in the direction of the lateral slider 42, forming an insertion space 154 that has a trapezoid cross section. Through this, the desired number of conductors 60 are aligned with each other in the insertion space 154. At the same time, the outer blade 148, over which the spring element 146 is fixed, is bent away from the sonotrode head 30, as is immediately seen from FIG. 12.

The top view according to FIG. 13 shows that a corresponding spring element is also arranged along opposite outer surfaces of the lateral slider 42, as seen in FIG. 11 and FIG. 12 respectively, so that the reference sign 146 can also be used for them.

In order to facilitate the introduction of conductors 62, 64 into the insertion space 48, a further development of the invention, according to FIG. 4, provides for the outer blade 50 that comprises the guide or lead blade, in its section 66, adjacent to the inner blade 54, to run at an angle α to the first defining surface 36 of the defining element 38. This angle notwithstanding, there is no impairment of the desired and proper alignment of the conductors 62, 64. The angle α will ideally range between 15° and 60°.

According to FIGS. 5-7, there are several options for adjusting the insertion space 48 to a desired width B or, as the case may be, for removing an insertion aid, such as the spring plate 46, when it is not needed.

The spring plate 46, according to FIG. 5, can be attached to a piston 68 of a cylinder 70, in which case, corresponding to the presentation according to FIG. 5, it can be removed by withdrawing the piston 68 from the compression space, which is defined by the sonotrode or, as the case may be, by the sonotrode head 30, the defining element 38, the counter electrode 34, and the lateral slider 42. In this case, the piston 68 can be attached to a desired section of the spring plate 46, without a more detailed explanation being necessary.

In the version shown in FIG. 5, the spring plate 46 is pivotable, enabling it to be removed from the area containing the conductors that are supposed to be welded, while welding takes place, that is, during welding or at times when the spring plate 46 is not needed or required.

There is also the possibility of connecting the spring plate 46 to the drive 71 of a catch, which is not shown, for the lateral slider 42, which determines the width of the compression space receiving the conductors, and therefore limits the adjustable path 52 of the lateral slider 42 in the direction of the defining element 38. These measures provide the possibility of setting the width of the insertion space 48 in relation to the catch, as the width of the insertion space 38—like that of the compression chamber 18—must be set according to the number or the cross-sectional width of the conductors that are to be welded. A spindle drive is the preferred option for a drive 71, which engages a corresponding gearing 72 originating from the spring plate 46.

Another version of the guide element that determines the width of the insertion space 48 is seen in FIGS. 8 and 9. The guide element is depicted there as a laminar guide element, as the geometry of guide plate 74 shows, and which stretches open a level that runs parallel to the adjustable path 52 of the lateral slider 42 and perpendicular to the section 28 of the sonotrode head 30, on which rest several of the conductors 44, 45, 60 to be welded. In this version, the guide plate 74 is affixed to the lateral slider 42, that is, to at least one of the correspondingly running outer surfaces 76, but is, however, displaceable relative to the lateral slider 42. This is implemented by slots 78, 80 in the guide plate 74 that run parallel to the adjustable path 42 and by protrusions like pins, which emerge from the outer surface 76 of the lateral slider 42 and engage the slots 78, 80. In addition, the guide plate 74, in this example of an embodiment, is connected via a pull-spring 82 with a catch 84 that is stationary in relation to the lateral slider 42, which impinges on the guide plate 74 in the direction of the defining element 38. In that way, the guide plate 74, with its guide or lead section 86 running vertically in the example shown, runs in front of the limiting surface 40 of the lateral slider 42, relative to the limiting element 38, so that corresponding to the teaching of the invention, the insertion space 48 is adjustable to the cross-sectional area or the number of conductors 44 with an open compression chamber.

In order to adjust the insertion space 48 to different numbers of conductors 60 or, as the case may be, to different cross-sectional widths, there is provision for a catch 87, which can be positioned according to the width of the insertion space 48. A protrusion 89 of the guide plate runs in the path of the catch and comes to rest on the catch 87 (see FIG. 8) when the desired width of the insertion space 48 has been reached, that is, the gap between the guide section 86 and the first defining surface 36 that is necessary for the desired alignment of the conductors 44, 45. When, as is preferable, the catch 87, is movable, it can also be arranged in a stationary position in relation to the lateral slider 42, and thus the guide plate 74. In such cases, the catch 87 is arranged in relation to the section 89 of the guide plate 74 in such a way that the insertion space 48 has a width that ensures that when two conductors are inserted, they can be arranged one above the other in the insertion space 48.

FIG. 14 demonstrates a further development of the teaching of the invention as demonstrated in the versions depicted in FIGS. 8 and 9. There is the possibility to combine the guide plate 74 with a drive 92, in order to adjust the first defining surface 36 to the desired extent, that is, to set the width of the insertion space 48.

In order to enlarge the insertion space 48, or to open it completely, a further development provides for the lateral slider 42 to be provided with an engaging piece 88 that locks into a slot 90 in the guide plate 74, so that when the lateral slider 42 is reversed, the guide plate 74 is carried with it, regardless of the pressure exerted by the spring 82, thereby enlarging the insertion space 48. The engagement interaction of lateral slider 42 and guide plate 74 is not necessary if the latter is provided with a drive.

The guide plate 74, as mentioned above, displays a rectangular geometry, in which the longitudinal blades 94, 96 run parallel to the adjustable path 52 of the lateral slider 42. The longitudinal blades 94, 96 merge into the guide section 86, which runs perpendicular to them, and which is slanted in the transitional area to the longitudinal blade 94, which is farther away from the sonotrode head, in order to facilitate the insertion of the conductors 60.

FIGS. 15 and 16 show additional configurations of guide elements 158, 160, which, in accordance with the invention described above, are attached to a compression chamber of an ultrasound welding device, so that corresponding reference signs can be used for the same elements. The respective guide element 158, 160 has an insertion space 162, 164, in which the conductors 44, 45 can be aligned to the desired extent, without having to change the width of the compression chamber 18. What is more, the compression chamber 18 can be open, that is, with the lateral slide 42 drawn away from the defining element 36. In other words, the insertion space 162, 164, has an effective cross section, that is, a width in particular, that is not only smaller than the effective cross section of the compression chamber 18 in open condition, but which, corresponding to the teaching of the invention, ensures that the conductors 44, 45 are properly aligned with each other, being, in the example shown, aligned in vertical rows. Here, unlike the embodiments in FIGS. 1-9 and 11-14, the insertion space 162, 164, is in each case limited by a blade 166, 168 or, as the case may be, 170, 174 of the guide element 158, 160. Here, the blades 166, 168 or 172, 174, run along or parallel, or approximately parallel, to the first and second defining surfaces 36 or, as the case may be, 40 of the first defining element 38 or, as the case may be, of the slider 42. The blades 166, 168 or 172, 174 form the side arms of a U-shaped section 176, 178 of the guide element 158, 160, which is preferably comprised of a spring plate, as the drawings illustrate. The respective diagonal blade 180, 182 of the U-shaped section 176, 178, according to FIG. 15 runs below the section 28 of the sonotrode head 30 that defines the compression chamber 48 and displays the geometry of an "O" or, as the case may be, an open circle. In that way, the section 28 of the sonotrode head 30 forms the floor of the insertion space 162.

According to the version presented in FIG. 16, the diagonal blade 182 runs above the section 28 of the sonotrode head 30, thereby forming the floor of the insertion space 164, on which the conductor 44 rests in the version depicted here.

Due to the analogous construction of the guide elements 158, 160, there is also the advantage that the guide element 158, 160, for example, can be moved out of the open compression chamber 148, in order to initially allow the unobstructed insertion of conductors. Due to the pocket-like shape of the diagonal blade 180 of the guide element 158, there can be alignment of the conductors 44, 45 when lowering the guide element 158 into the compression chamber 18, when the space 184 that is surrounded by the diagonal blade 180 is lowered in the area below the section 28 of the sonotrode head 30, resulting in guided alignment of the conductors 44, 45 between the section 28 of the sonotrode head 30 and the lateral blades 166, 168. This type of construction is advantageous particularly when the gap between the lateral blades 166, 168 is greater than the respective cross section of the conductors that are to be inserted.

In order to ensure a secure guiding when inserting conductors into the insertion space 48, spring plates 48 or guide plates 74 can be arranged on the opposite outer surfaces 76 of the lateral slider 42, corresponding to a guiding or leading function.

Although the guide or lead element preferably consists of plate material, other suitable materials can also be used, although for the arched lead element 48, the required elasticity must be assured, as well as the necessary rigidity for the laminar element 74.

Although the teaching of the invention has been explained using the example of a compression chamber that is defined by four elements, a realization of such a compression chamber is also possible using a different number of elements, such as three elements, for example, in order to weld a node displaying the geometry of a triangle. In that case, the guide element corresponding to the elements defining the compression chamber must be adjustable in such as way that an insertion space is provided, with which the advantages that can be gained from the teaching of the invention can realized, i.e. that the conductors that are to be compressed or welded together are correctly aligned with each other in such as way that they are arranged in one or more rows when they are welded.

The invention claimed is:

1. An arrangement for the welding of workpieces by means of an ultrasound welding device comprising a compression chamber into which the workpieces are inserted and which is defined by at least sections of a sonotrode emitting ultrasound vibrations and a counter electrode and a defining element which has a first defining surface that runs perpendicular to sections of the sonotrode and the counter electrode, as well as a sliding element with a second defining surface that is adjustable in relation to the first defining surface,
    wherein workpieces can, with the compression chamber open, be inserted into an insertion space which is defined by at least the sections of the sonotrode and the first defining surface of the defining element,
    the insertion space being defined by:
    sections of the sonotrode and the defining element, as well as by a guide element that runs with a guide section along the first defining surface of the defining element, where a gap (B) between the guide section of the guide element and the first defining surface is smaller than a gap between the first defining surface and the second defining space of the sliding element with the compression chamber open.

2. An arrangement according to claim 1, wherein the guide element, when closing the compression chamber, can be bent away and/or displaced.

3. An arrangement according to claim 1, wherein the guide element is a spring element.

4. An arrangement according to claim 1, wherein the guide element is an arched spring sheet with at least two legs, one of the at least two legs extending along an adjustable path of the sliding element, and another of the at least two legs being a guide section of the guide element that extends along the first defining surface.

5. An arrangement according to claim 4, wherein the arched spring sheet displays the geometry of an open quadrangle.

6. An arrangement according to claim 1, wherein the guide element as a spring sheet displays the geometry of a "U" with legs of different lengths, a longer leg being a holding leg of the guide element.

7. An arrangement according to claim 6, wherein the guide element is bendable such that a vertical leg running along the first defining surface defines a trapezoidal insertion space.

8. An arrangement according to claim 1, wherein a spring sheet comprises a holding leg, a first inner leg that runs perpendicular thereto, a second inner leg that runs along an adjustable path of the sliding element and an outer leg running along the first defining surface being the guide section.

9. An arrangement according to claim 8, wherein the holding leg and the first and second inner legs display the geometry of a "U" with legs of different lengths.

10. An arrangement according to claim 1, wherein the guide element extends along an outer surface of the sliding element.

11. An arrangement according to claim 1, wherein the guide section of the guide element extends along a length of the first defining surface and is longer than the length of the first defining surface with the compression chamber closed.

12. An arrangement according to claim 1, wherein a diagonal section of the guide section runs at an angle ($\alpha$) to the first defining surface.

13. An arrangement according to claim 12, wherein the diagonal section of the guide section runs at angle ($\alpha$) to the first defining surface and merges into a leg that runs along an adjustable path of the sliding element.

14. An arrangement according to claim 12, wherein $15° < \alpha < 60°$.

15. An arrangement according to claim 1, wherein the guide element is combined with a drive and is displaceable by the drive.

16. An arrangement according to claim 15, wherein an adjustable path of the sliding element is limited in the direction of the first defining surface of the defining element by a catch, which is adjustable by means of an actuator, the guide element being combined with the drive or a separate drive.

17. An arrangement according to claim 16, wherein the drive is a spindle drive.

18. An arrangement according to claim 1, wherein the guide element runs along each outer surface of the sliding element that runs perpendicular or approximately perpendicular to the sections of the sonotrode.

19. An arrangement according to claim 1, wherein the guide element is a laminar element which runs parallel or approximately parallel to an outer surface of the sliding element, wherein the outer surface of the sliding element runs parallel to an adjustable path of the sliding element and perpendicular to the sections of the sonotrode.

20. An arrangement according to claim 19, wherein the laminar element is combined with the sliding element and adjustable in relation thereto.

21. An arrangement according to claim 19, wherein the laminar element is combined with a spring element, by means of which the laminar element is adjustable relative to the sliding element in the direction of the first defining surface.

22. An arrangement according to claim 19, wherein the laminar element has at least one slot running parallel to the adjustable path, into which a protrusion from the sliding element meshes.

23. An arrangement according to claim 19, wherein the laminar element has two slots running parallel to the adjustable path, into which one of the protrusions from the sliding element meshes.

24. An arrangement according to claim 19, wherein the laminar element is rectangular in form and has first and second longitudinal legs that run along the adjustable path, and a transverse leg that connects to the longitudinal legs, running along the first defining surface and forming the guide section.

25. An arrangement according to claim 24, wherein a transitional area between a transverse leg and a longitudinal leg of the element that lies further away from the sonotrode is slanted.

26. An arrangement according to claim 19, wherein an engaging piece originating from the sliding element meshes into the laminar element or a further element originating therefrom, in order to maintain the laminar or further element at a distance from the first defining surface.

27. An arrangement according to claim 19, wherein the laminar element is adjustable to the first defining surface by means of a drive.

* * * * *